United States Patent
Lin et al.

(10) Patent No.: US 8,901,435 B2
(45) Date of Patent: Dec. 2, 2014

(54) HYBRID WIRING BOARD WITH BUILT-IN STOPPER, INTERPOSER AND BUILD-UP CIRCUITRY

(75) Inventors: Charles W. C. Lin, Singapore (SG); Chia Chung Wang, Hsinchu (TW)

(73) Assignee: Bridge Semiconductor Corporation, Taipei (TW)

( * ) Notice: Subject to any disclaimer, the term of this patent is extended or adjusted under 35 U.S.C. 154(b) by 211 days.

(21) Appl. No.: 13/615,819

(22) Filed: Sep. 14, 2012

(65) Prior Publication Data
US 2014/0048324 A1 Feb. 20, 2014

Related U.S. Application Data

(60) Provisional application No. 61/682,801, filed on Aug. 14, 2012.

(51) Int. Cl.
 *H01L 23/498* (2006.01)
 *H05K 1/11* (2006.01)
(52) U.S. Cl.
 USPC ............................ 174/266; 257/737; 428/209
(58) Field of Classification Search
 CPC ... H05K 1/028; H05K 1/0296; H05K 1/0298; H05K 1/11; H05K 1/14; H05K 1/18; H05K 3/36; H05K 3/30; H05K 2003/4007; H05K 2201/04; H05K 2201/09409; H05K 2201/09818; H05K 2201/2018; H05K 2201/20
 USPC ......................................................... 174/266
 See application file for complete search history.

(56) References Cited

U.S. PATENT DOCUMENTS

| | | | |
|---|---|---|---|
| 6,861,720 B1 | 3/2005 | Heckman et al. | |
| 7,042,077 B2 * | 5/2006 | Walk et al. | 257/686 |
| 7,378,733 B1 * | 5/2008 | Hoang et al. | 257/724 |
| 7,405,103 B2 | 7/2008 | Chang | |
| 7,586,188 B2 | 9/2009 | Chang | |
| 7,994,432 B2 | 8/2011 | Kariya et al. | |
| 8,008,583 B2 | 8/2011 | Kariya et al. | |
| 8,143,531 B2 | 3/2012 | Miki et al. | |
| 2005/0266214 A1 * | 12/2005 | Usui et al. | 428/209 |
| 2006/0124351 A1 * | 6/2006 | Kusano et al. | 174/261 |
| 2009/0255716 A1 | 10/2009 | Kariya et al. | |
| 2010/0022054 A1 | 1/2010 | Ueda et al. | |
| 2010/0062564 A1 | 3/2010 | Sakaguchi et al. | |
| 2010/0294552 A1 | 11/2010 | Kobayashi et al. | |
| 2011/0079913 A1 | 4/2011 | Chino | |
| 2012/0049366 A1 | 3/2012 | Zeng | |
| 2012/0126399 A1 * | 5/2012 | Lin et al. | 257/737 |
| 2013/0032938 A1 * | 2/2013 | Lin et al. | 257/737 |

FOREIGN PATENT DOCUMENTS

| | | | | |
|---|---|---|---|---|
| DE | EP 0817550 | * | 1/1998 | ............... H05K 3/30 |
| EP | 817550 A1 | * | 1/1998 | |

* cited by examiner

*Primary Examiner* — Timothy Thompson
*Assistant Examiner* — Michael F McAllister
(74) *Attorney, Agent, or Firm* — Bacon & Thomas, PLLC

(57) ABSTRACT

A hybrid wiring board includes an interposer, a stopper, a stiffener and a build-up circuitry. The stopper is laterally aligned with and laterally extends beyond peripheral edges of the interposer in lateral directions. The interposer extends into an aperture of the stiffener and is electrically connected to the build-up circuitry. The build-up circuitry covers the stopper, the interposer and the stiffener and provides signal routing for the interposer. The stiffener provides mechanical support, ground/power plane and heat sink for the build-up circuitry.

12 Claims, 10 Drawing Sheets

HYBRID WIRING BOARD WITH BUILT-IN STOPPER, INTERPOSER AND BUILD-UP CIRCUITRY

CROSS REFERENCE TO RELATED APPLICATION

This application claims the benefit of filing date of U.S. Provisional Application Ser. No. 61/682,801, entitled "Structure and Manufacture of Semiconductor Assembly and 3D Stacking thereof" filed Aug. 14, 2012 under 35 USC §119(e)(1).

BACKGROUND OF THE INVENTION

1. Field of the Invention

The present invention relates to a hybrid wiring board, and more particularly to a hybrid wiring board with a built-in stopper, which includes an interposer, a stopper, a stiffener and a build-up circuitry.

2. Description of Related Art

Conventional flip-chip package includes a semiconductor die that is flipped and bonded to a laminate substrate through an array of solder bumps. The matching contact pads of the laminate substrate typically have a finer pitch than that of the backside contact pads so that the laminate substrate can accommodate high I/O chip and allow the assembled package easily attaches to a printed circuit board for next level assembly. To meet even finer feature and higher performance requirements, modern semiconductor chip incorporates a low-k dielectric as the interlayer material. As low-k dielectric material is porous, fragile and very sensitive to the interfacial stresses, conventional flip chip packages encounter various reliability and yield loss issues due to CTE mismatch between the low-k die and the laminate substrate. Therefore, incorporating a through-via interposer which has a similar CTE to that of the low-k die as a buffer is desirable to resolve the manufacturing yield and reliability concerns.

Various through-via interposers such as silicon, glass or ceramic which have similar CTE to that of the silicon are suitable for this purpose. The through-via interposer can be attached to a laminate substrate by solder bumps or it can be embedded in a build-up circuitry to form a hybrid wiring board so that the overall electrical performance can be further improved. However, as the hybrid wiring board is a non-symmetrical structure and the interposer has a different CTE to that of the build-up circuitry, a warp of the hybrid wiring board can easily occur and this will result in a not mountable interposer for low-k semiconductor chip. Furthermore, as the interposer needs to be mounted on the circuitry first before forming a highly precise conductive via for interconnection, it is impossible to align the contact pad with a laser beam if the interposer placement accuracy is not secured or if the die attach adhesive underneath the interposer "reflow" during the adhesive curing stage. As a result, a deterioration of yield or reliability might be caused.

SUMMARY OF THE INVENTION

The present invention has been developed in view of such a situation, and an object thereof is to provide a hybrid wiring board in which an interposer is affixed on a build-up circuitry for an interconnecting chip and the build-up circuitry, warp and bend of the interposer can be suppressed, and electrical connection between the interposer to the build-up circuitry can be securely retained by conductive via. Accordingly, the present invention provides a hybrid wiring board that includes an interposer, a stopper, a stiffener and build-up circuitry.

In a preferred embodiment, the stopper serves as a placement guide for the interposer. The stopper is laterally aligned with and laterally extends beyond peripheral edges of the interposer in lateral directions. The interposer extends into an aperture of the stiffener and is electrically connected to the build-up circuitry. The build-up circuitry covers the stopper, the interposer and the stiffener and provides signal routing for the interposer. The stiffener can provide mechanical support, ground/power plane and heat sink for the build-up circuitry.

The stopper can be made of a metal, a photosensitive plastic material or non-photosensitive material. For instance, the stopper can consist essentially of copper, aluminum, nickel, iron, tin or their alloys. The interposer can also consist of epoxy or polyimide.

The stiffener can extend to peripheral edges of the wiring board to provide mechanical support for the build-up circuitry and the interposer and can be a single layer structure or a multi-layer structure (such as a circuit board or a multi-layer ceramic board or a laminate of a substrate and a conductive layer). The stiffener can be made of ceramics, metal or other various inorganic materials, such as aluminum oxide ($Al_2O_3$), aluminum nitride (AlN), silicon nitride (SiN), silicon (Si), copper (Cu), aluminum (Al), stainless steel, etc. The stiffener can also be made of organic materials such as copper-clad laminate.

The interposer, which includes one or more first contact pads and one or more second contact pads on two opposite surfaces thereof, can be located within the aperture or extend within and outside the aperture at a predetermined location that is defined by the stopper. In any case, the interposer and the stopper extend into the aperture, and the stopper is in close proximity to and is laterally aligned with and laterally extends beyond peripheral edges of the interposer in the lateral direction to prevent the interposer from undesirable movement. Besides, the interposer can further include one or more connecting elements (such as through vias) that electrically connect the first contact pads that face the first vertical direction and the second contact pads that face the second vertical direction and exposed from the aperture. For instance, the interposer can be a silicon, glass or ceramic interposer.

The build-up circuitry can include a first dielectric layer and one or more first conductive traces. For instance, the first dielectric layer covers the interposer, the stopper and the stiffener in the first vertical direction and can extend to peripheral edges of the wiring board, and the first conductive traces extends from the first dielectric layer in the first vertical direction.

The first dielectric layer includes one or more first via openings that are disposed adjacent to the first contact pads of the interposer and optionally adjacent to the stiffener. One or more first conductive traces are disposed on the first dielectric layer (i.e. extend from the first dielectric layer in the first vertical direction and extend laterally on the first dielectric layer) and extend into the first via openings in the second vertical direction to provide signal routing for the first contact pads of the interposer and optionally provide electrical connections for the stiffener. Specifically, the first conductive traces can directly contact the first contact pads to provide signal routing for the interposer, and thus the electrical connection between the interposer and the build-up circuitry can be devoid of solder. The first conductive traces can also directly contact the stiffener for grounding or electrical connections to passive components such as thin film resistors or capacitors deposited thereon.

The build-up circuitry can include additional layers of dielectric, additional layers of via openings, and additional layers of conductive traces if needed for further signal routing. For instance, the build-up circuitry can further include a second dielectric layer, one or more second via openings and one or more second conductive traces. The second dielectric layer with one or more second via openings disposed therein is disposed on the first dielectric layer and the first conductive traces (i.e. extends from the first dielectric layer and the first conductive traces in the first vertical direction) and can extend to peripheral edges of the wiring board. The second via openings are disposed adjacent to the first conductive traces. One or more second conductive traces are disposed on the second dielectric layer (i.e. extend from the second dielectric layer in the first vertical direction and extend laterally on the second dielectric layer) and extend into the second via openings in the second vertical direction to provide electrical connections for the first conductive traces. Furthermore, the first via openings and the second via openings can have the same size, and the first dielectric layer, the first conductive traces, the second dielectric layer and the second conductive traces can have flat elongated surfaces that face in the first vertical direction.

The build-up circuitry can include one or more interconnect pads to provide electrical contacts for the next level assembly or another electronic device such as a semiconductor chip, a plastic package or another semiconductor assembly. The interconnect pads extend to or beyond the first conductive traces in the first vertical direction and include an exposed contact surface that faces in the first vertical direction. For instance, the interconnect pad can be adjacent to and integral with the second conductive trace. In addition, the first conductive trace and the second conductive trace can provide an electrical interconnection between the interconnect pad and the first contact pad of the interposer disposed at the aperture of the stiffener. As a result, the electrical contacts (i.e. the second contact pads of the interposer and the interconnect pads of the build-up circuitry) can be electrically connected to one another and located on opposite surfaces that face in opposite vertical directions so that the wiring board can be used for a three-dimensional semiconductor assembly.

The hybrid wiring board of the present invention can further include a placement guide. The placement guide for the stiffener can be in close proximity to and laterally aligned with and laterally extend beyond the outer peripheral edges of the stiffener in lateral directions. Like the stopper, the placement guide for the stiffener can be made of a metal, a photosensitive plastic material or non-photosensitive material, such as copper, aluminum, nickel, iron, tin, alloys, epoxy or polyimide.

The stopper and the placement guide can contact and extend from the first dielectric layer in the second vertical direction and have patterns against undesirable movement of the interposer and the stiffener, respectively. For instance, the stopper and the placement guide can include a continuous or discontinuous strip or an array of posts. The stopper and the placement guide can be simultaneously formed and have the same or different patterns. Specifically, the stopper can be laterally aligned with four lateral surfaces of the interposer to stop the lateral displacement of the interposer. For instance, the stopper can be aligned along and conform to four sides, two diagonal corners or four corners of the interposer and a gap in between the interposer and the stopper preferably is in a range of about 0.001 to 1 mm. The interposer can be spaced from the inner wall of the aperture by the stopper, and a bonding material can be added between the interposer and the stiffener to enhance rigidity. Moreover, the stopper can also be in close proximity to and laterally aligned with the inner wall of the aperture to stop the lateral displacement of the stiffener. Likewise, the placement guide can be laterally aligned with four outer lateral surfaces of the stiffener to stop the lateral displacement of the stiffener. For instance, the placement guide can be aligned along and conform to four outer sides, two outer diagonal corners or four outer corners of the stiffener and a gap in between the outer peripheral edges of the stiffener and the placement guide preferably is in a range of about 0.001 to 1 mm. Besides, the stopper and the placement guide preferably have a thickness in a range of 10-200 microns.

The interposer and the stiffener can be affixed and mechanically connected to the build-up circuitry using an adhesive. The adhesive can contact the interposer, the stiffener, the stopper and the placement guide and is sandwiched between the interposer and the build-up circuitry and between the stiffener and the build-up circuitry. In any case, the adhesive can be coplanar with the stopper and the placement guide in the first vertical direction and lower than the stopper and the placement guide in the second vertical direction. As the adhesive underneath the interposer and the stiffener is lower than the stopper and the placement guide in the second vertical direction, the stopper and the placement guide can stop the undesirable movement of the interposer and the stiffener due to adhesive curing.

The present invention also provides a three-dimensional semiconductor assembly in which a semiconductor device such as chip can be electrically connected to the second contact pad of the interposer. The semiconductor device can be electrically connected to the second contact pad that is exposed from the aperture of the stiffener using a wide variety of connection media including gold or solder bumps.

The assembly can be a first-level or second-level single-chip or multi-chip device. For instance, the assembly can be a first-level package that contains a single chip or multiple chips. Alternatively, the assembly can be a second-level module that contains a single package or multiple packages, and each package can contain a single chip or multiple chips.

The present invention has numerous advantages. The stiffener can provide a power/ground plane, a heat sink and a robust mechanical support for the interposer and the build-up circuitry. The stopper can accurately confine the placement location of the interposer and avoid the electrical connection failure between the interposer and the build-up circuitry resulted from the lateral displacement of the interposer, thereby improving the manufacturing yield greatly. The direct electrical connection without solder between the interposer and the build-up circuitry is advantageous to high I/O and high performance. The wiring board and the semiconductor assembly using the same are reliable, inexpensive and well-suited for high volume manufacture.

These and other features and advantages of the present invention will be further described and more readily apparent from a review of the detailed description of the preferred embodiments which follows.

BRIEF DESCRIPTION OF THE DRAWINGS

The following detailed description of the preferred embodiments of the present invention can best be understood when read in conjunction with the following drawings, in which:

FIGS. 1A' and 1B' are cross-sectional views showing an alternative method of forming a stopper on a dielectric layer in accordance with an embodiment of the present invention;

DETAILED DESCRIPTION OF THE PREFERRED EMBODIMENT

Hereafter, examples will be provided to illustrate the embodiments of the present invention. Other advantages and effects of the invention will become more apparent from the disclosure of the present invention. It should be noted that these accompanying figures are simplified. The quantity, shape and size of components shown in the figures may be modified according to practically conditions, and the arrangement of components may be more complex. Other various aspects also may be practiced or applied in the invention, and various modifications and variations can be made without departing from the spirit of the invention based on various concepts and applications.

Embodiment 1

Figure 1A:
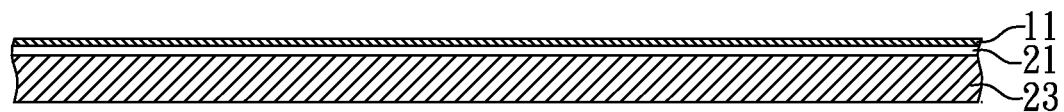
FIGS. 1A and 1B are cross-sectional views showing a method of forming a stopper on a dielectric layer in accordance with an embodiment of the present invention.
Figure 1B:
Figure 1C:
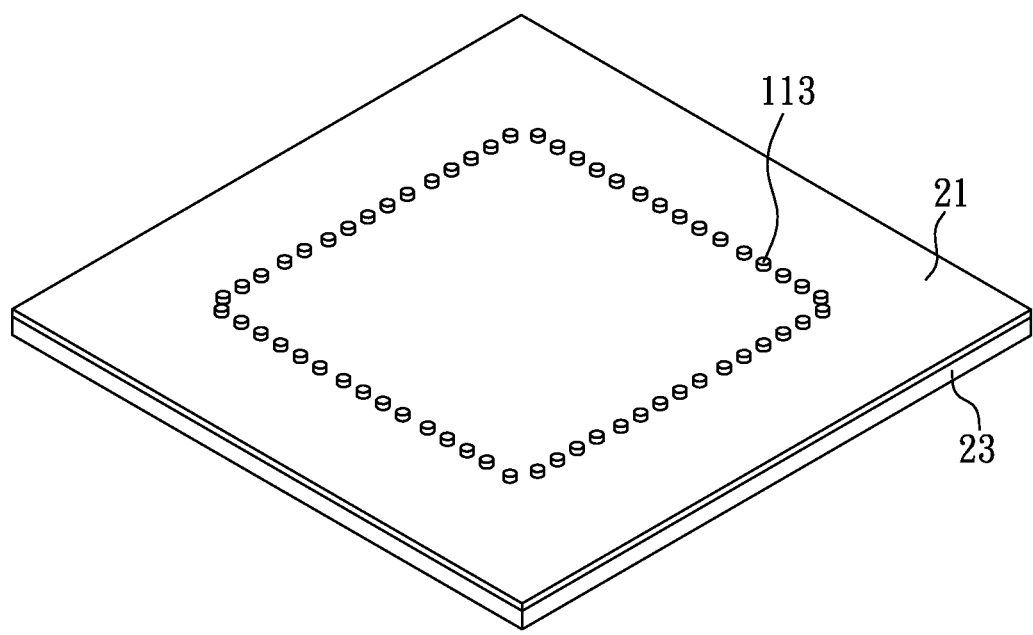
FIG. 1C is a top view corresponding to FIG. 1B.
Figure 1A:
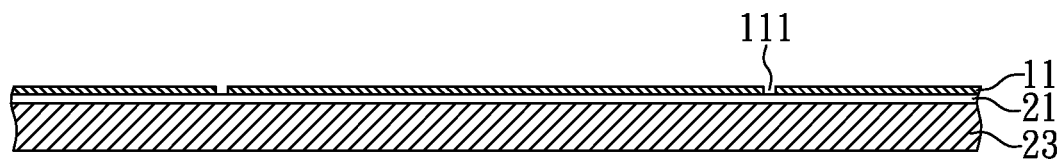
Figure 1B:
Figure 1C:
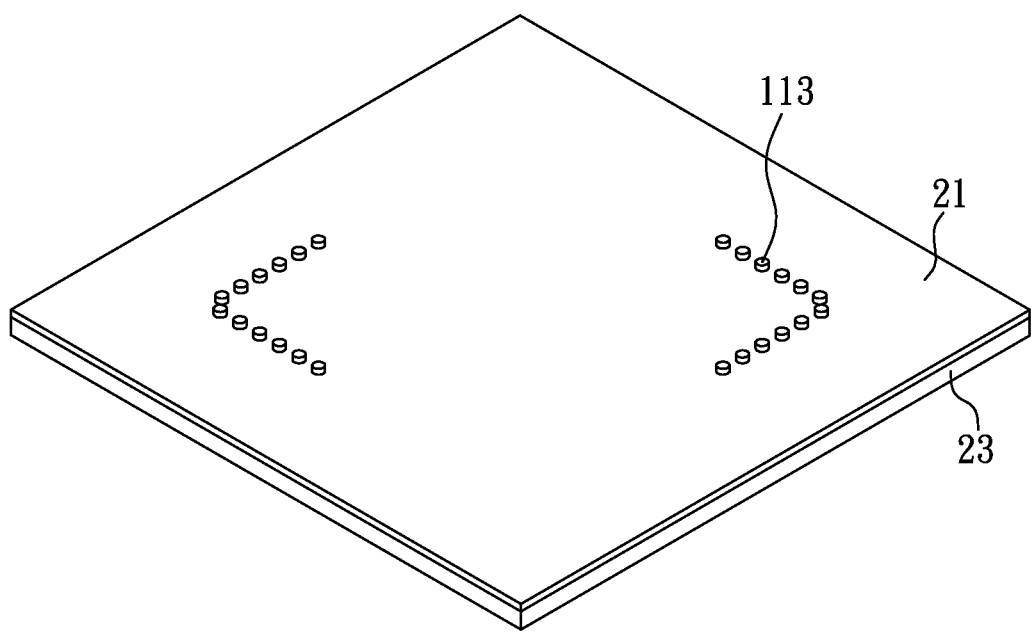
Figure 1D:
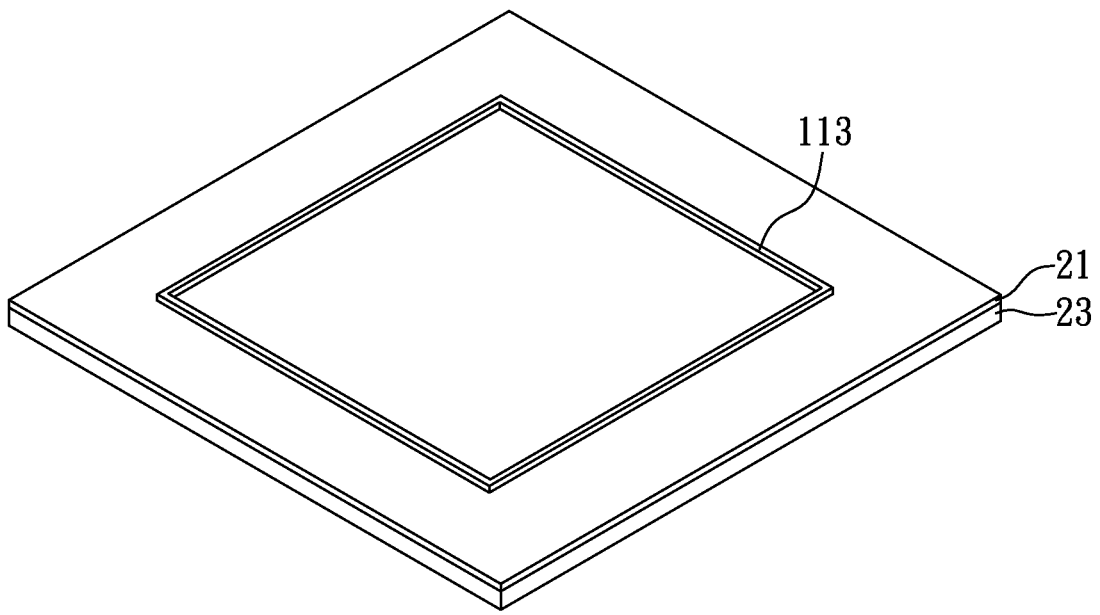
FIGS. 1D-1G are top views of various stopper patterns that can be practiced in the present invention.
Figure 1E:
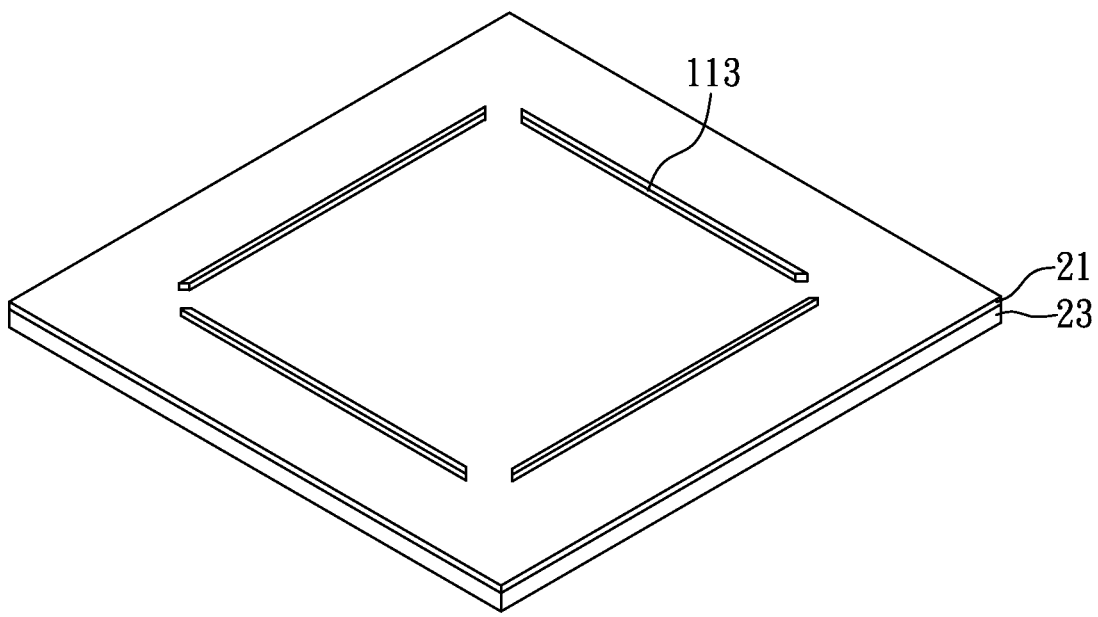

FIGS. 1A and 1B are cross-sectional views showing a method of forming a stopper on a dielectric layer in accordance with an embodiment of the present invention, and FIG. 1C is a top view corresponding to FIG. 1B.

FIG. 1A is a cross-sectional view of a laminate that includes metal layer 11, dielectric layer 21 and support plate 23. Metal layer 11 is illustrated as a copper layer with a thickness of 50 microns. However, metal layer 11 can also be made of other various metal materials and is not limited to a copper layer. Besides, metal layer 11 can be deposited on dielectric layer 21 by numerous techniques including lamination, electroplating, electroless plating, evaporating, sputtering, and their combinations as a single layer or multiple layers, and preferably has a thickness in a range of 10 to 200 microns.

Dielectric layer 21 typically is made of epoxy resin, glass-epoxy, polyimide and the like and has a thickness of 50 microns. In this embodiment, dielectric layer 21 is sandwiched between metal layer 11 and support plate 23. However, support plate 23 may be omitted in some embodiments. Support plate 23 typically is made of copper, but copper alloys or other materials are also doable. The thickness of support plate 23 can range from 25 to 1000 microns, and preferably ranges from 125 to 500 microns in consideration of process and cost. In this embodiment, support plate 23 is illustrated as a copper plate with a thickness of 200 microns.

FIGS. 1B and 1C are cross-sectional and top views, respectively, of the structure with stopper 113 formed on dielectric layer 21. Stopper 113 can be formed by removing selected portions of metal layer 11 using photolithography and wet etching. In this illustration, stopper 113 consists of plural metal posts in a rectangular frame array and conforms to four sides of an interposer subsequently disposed on dielectric layer 21. However, stopper patterns are not limited thereto and can be other various patterns against undesirable movement of the subsequently disposed interposer.

FIGS. 1A' and 1B' are cross-sectional views showing an alternative method of forming a stopper on a dielectric layer, and FIG. 1C' is a top view corresponding to FIG. 1B'.

FIG. 1A' is a cross-sectional view of a laminate with a set of cavities 111. The laminate includes metal layer 11, dielectric layer 21 and support plate 23 as above mentioned, and cavities 111 are formed by removing selected portions of metal layer 11.

FIGS. 1B' and 1C' are cross-sectional and top views, respectively, of the structure with stopper 113 formed on dielectric layer 21. Stopper 113 can be formed by dispensing or printing a photosensitive plastic material (e.g., epoxy, polyimide, etc.) or non-photosensitive material into cavities 111, followed by removing overall metal layer 11. Herein, stopper 113 is illustrated as an array of plural resin posts and conforms to two diagonal corners of a subsequently disposed interposer.

Figure 1F:
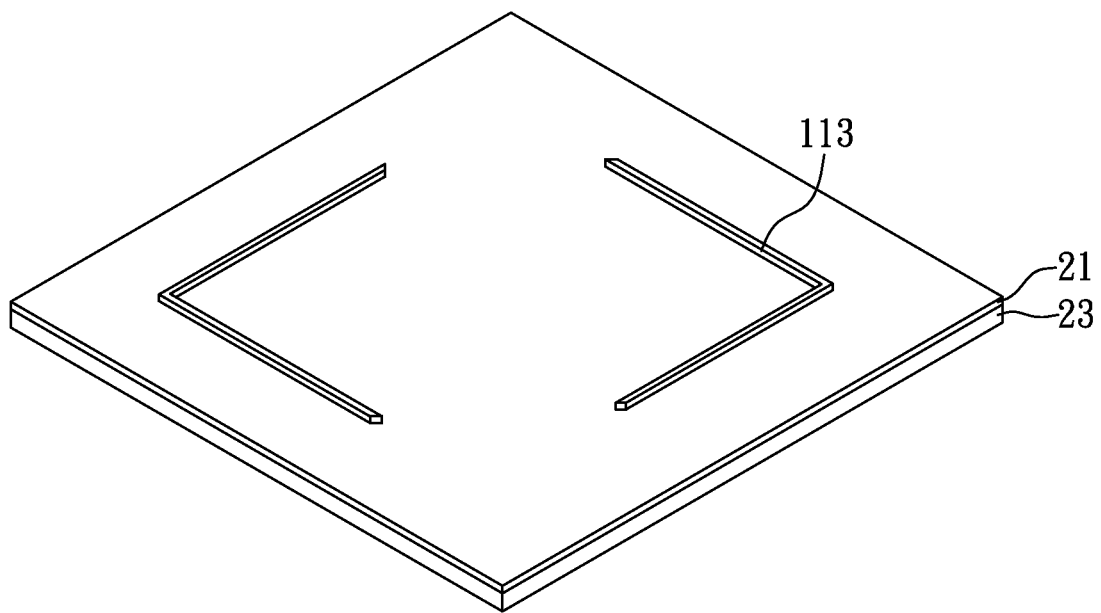
Figure 1G:
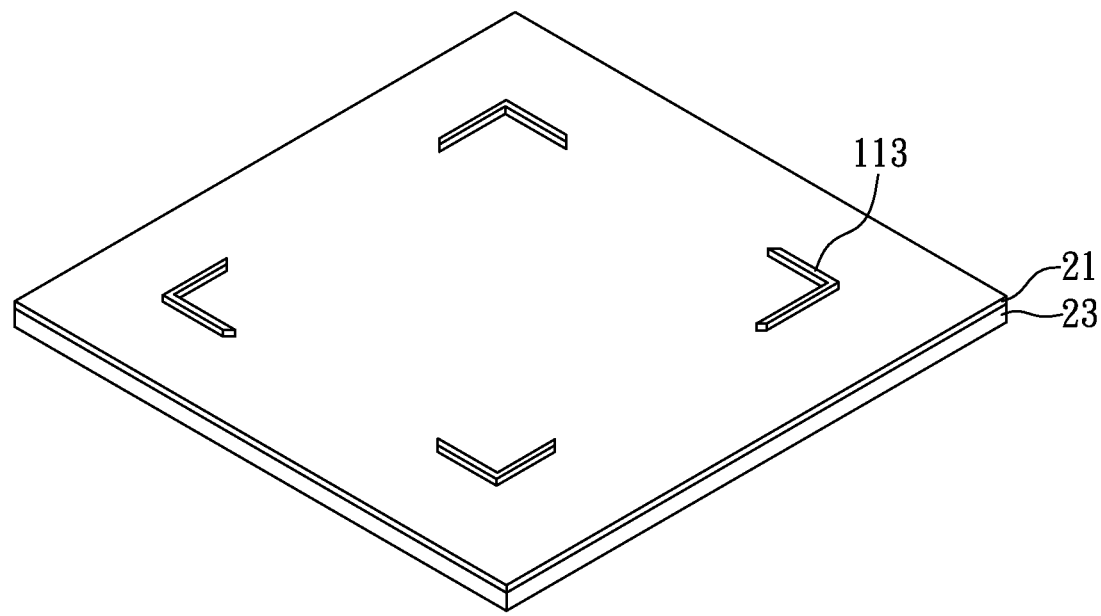

FIGS. 1D-1G are top views of other various stopper patterns for reference. For instance, stopper 113 may consist of a continuous or discontinuous strip and conform to four sides (as shown FIGS. 1D and 1E), two diagonal corners or four corners (as shown in FIGS. 1F and 1G) of a subsequently disposed interposer.

Figure 2A:
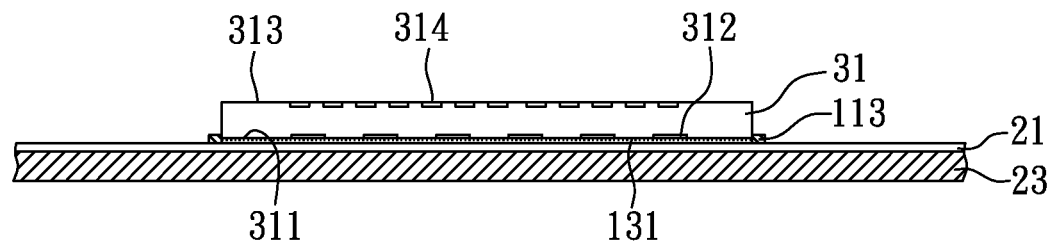
FIGS. 2A and 2B are cross-sectional views and top views, respectively, of the structure with an interposer mounted thereon in accordance with an embodiment of the present invention.
Figure 2B:
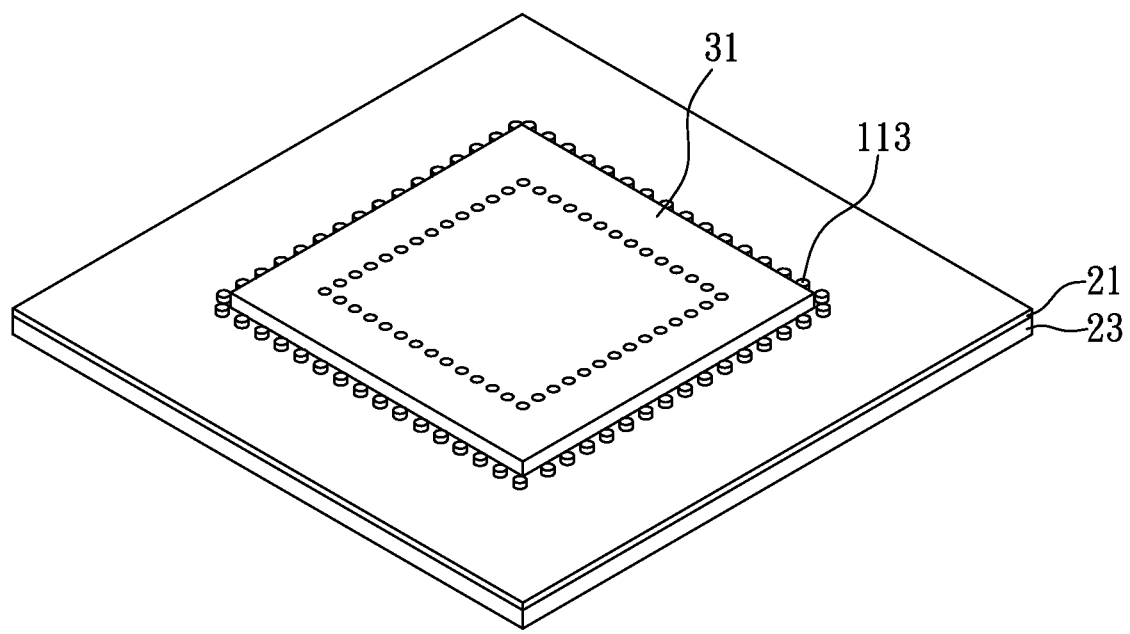

FIGS. 2A and 2B are cross-sectional and top views, respectively, of the structure with interposer 31 mounted on dielectric layer 21 using adhesive 131. Interposer 31 includes first surface 311, second surface 313 opposite to first surface 311, first contact pads 312 at first surface 311, second contact pads 314 at second surface 313, and through vias (not shown in the figures) that electrically connect the first contact pads 312 and the second contact pads 314. Interposer 31 can be a silicon interposer, a glass interposer or a ceramic interposer that contains a pattern of traces that fan out from a fine pitch at second contact pads 314 to a coarse pitch at first contact pads 312.

Stopper 113 can serve as a placement guide for interposer 31, and thus interposer 31 is precisely placed at a predetermined location with its first surface 311 facing dielectric layer 21. Stopper 113 extends from dielectric layer 21 beyond first surface 311 of interposer 31 in the upward direction and is laterally aligned with and laterally extends beyond four sides of interposer 31 in the lateral directions. As stopper 113 is in close proximity to and conforms to four lateral surfaces of interposer 31 in lateral directions and adhesive 131 under interposer 31 is lower than stopper 113, any undesirable movement of interposer 31 due to adhesive curing can be avoided. Preferably, a gap in between interposer 31 and stopper 113 is in a range of about 0.001 to 1 mm.

Figure 3A:
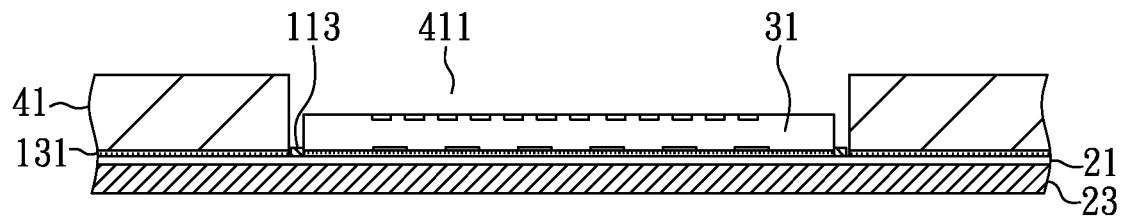
FIGS. 3A and 3B are cross-sectional views and top views, respectively, of the structure with a stiffener mounted thereon in accordance with an embodiment of the present invention.
Figure 3B:
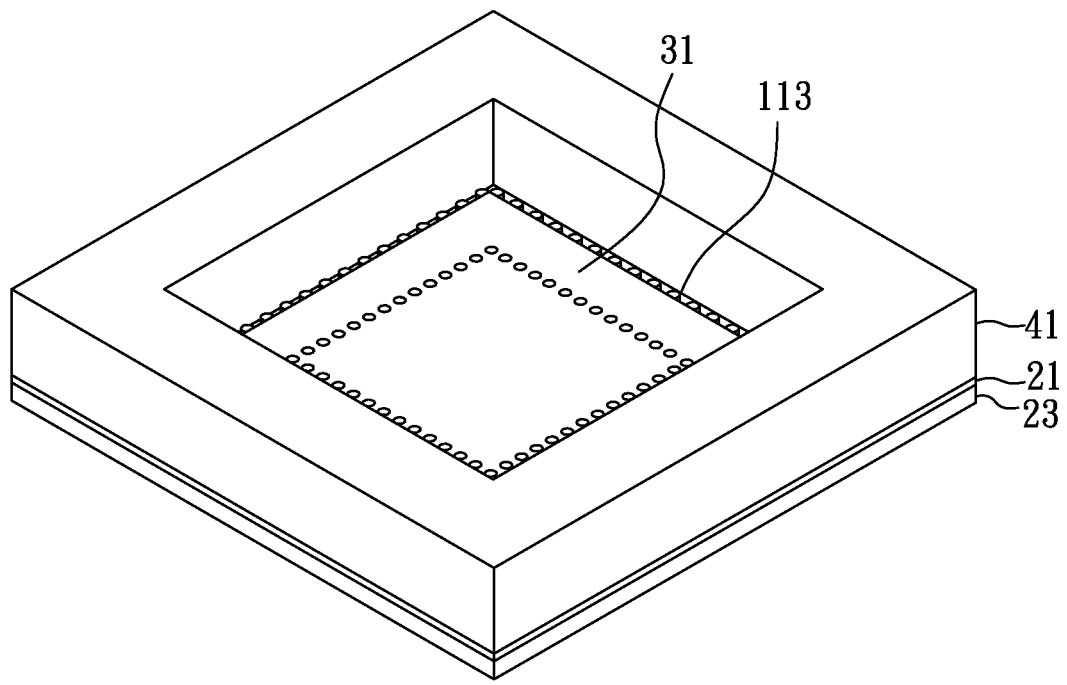

FIGS. 3A and 3B are cross-sectional and top views, respectively, of the structure with stiffener 41 mounted on dielectric layer 21 using adhesive 131. Interposer 31 and stopper 113 are aligned with and inserted into aperture 411 of stiffener 41 and stiffener 41 is mounted on dielectric layer 21 using adhesive 131. Aperture 411 is formed by mechanical drilling through stiffener 41 and can be formed with other techniques such as punching and laser cutting. Stiffener 41 is illustrated as a ceramic sheet with a thickness of about 0.6 mm, but also can be other single layer or multi-layer structures, such as a multi-layer circuit board or a metal sheet.

Interposer 31 and the inner wall of aperture 411 are spaced from one another by stopper 113. Stopper 113 is close proximity to and laterally aligned with four inner walls of aperture 411 and adhesive 113 under stiffener 41 is lower than stopper 113, and thus any undesirable movement of stiffener 41 also can be avoided before adhesive 131 is fully cured. Optionally, a bonding material (not shown in the figure) can be added between interposer 31 and stiffener 41 to enhance rigidity.

FIGS. 4A-4G are cross-sectional views showing a method of making a hybrid wiring board that includes an interposer, a stopper, a stiffener and build-up circuitry in accordance with an embodiment of the present invention.

Figure 4A:
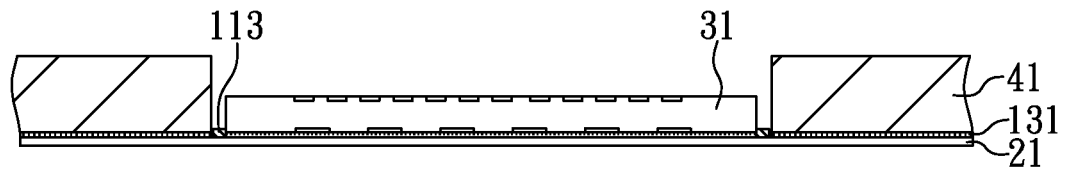
FIGS. 4A-4G are cross-sectional views showing a method of making a hybrid wiring board that includes an interposer, a stopper, a stiffener and a build-up circuitry electrically connected to the interposer in accordance with an embodiment of the present invention.
Figure 4B:
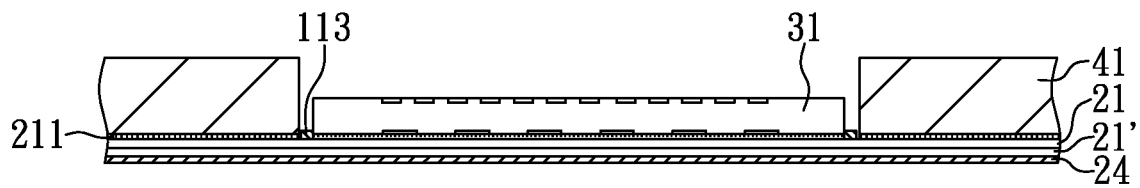
Figure 4C:
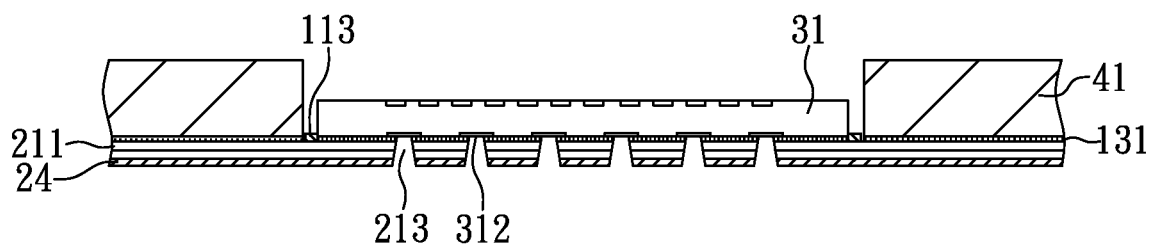
Figure 4D:
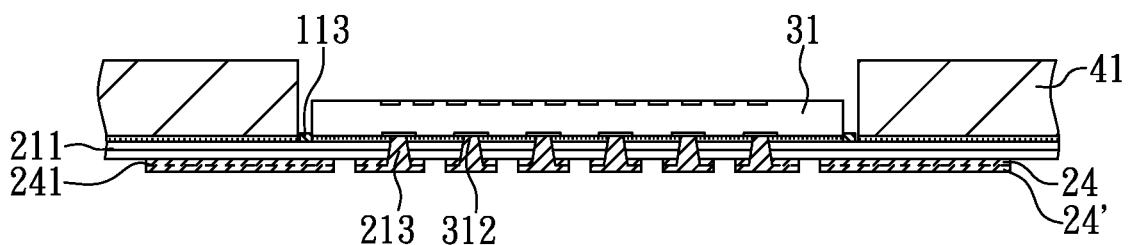
Figure 4E:
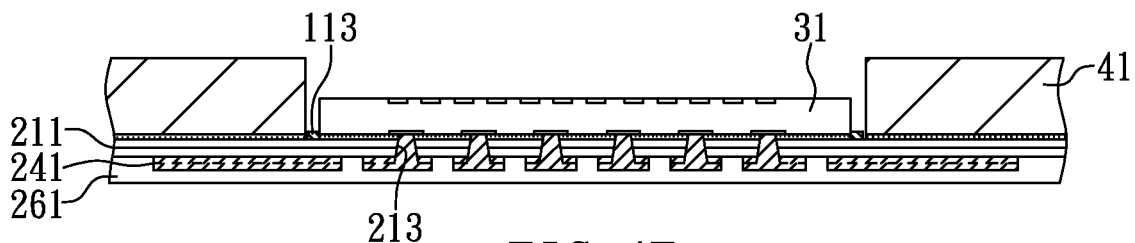
Figure 4F:
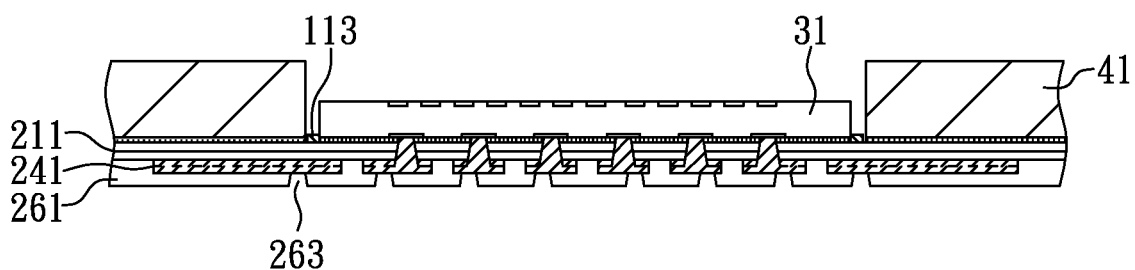
Figure 4G:
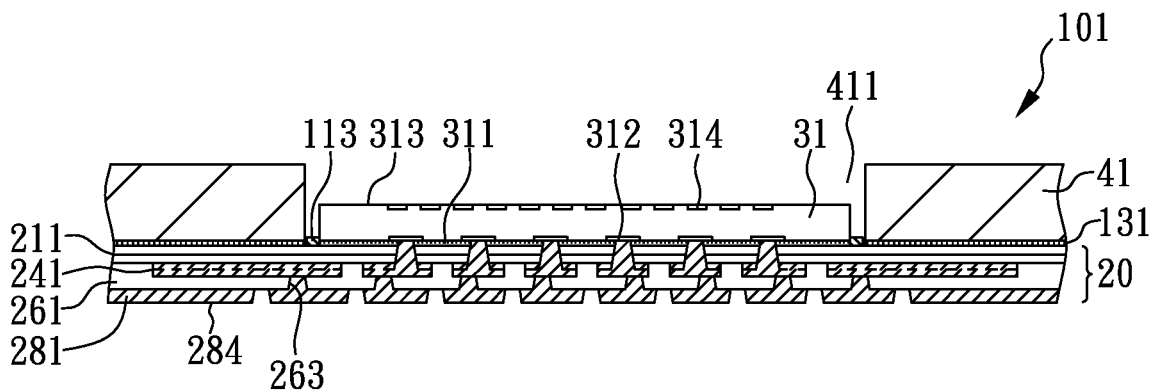

As shown in FIG. 4G, hybrid wiring board 101 includes interposer 31, stopper 113, stiffener 41 and build-up circuitry 20. Interposer 31 includes first surface 311, second surface 313 opposite to first surface 311, first contact pads 312 at first surface 311, second contact pads 314 at second surface 313, and through vias (not shown in the figures) that electrically connect first contact pads 312 and second contact pads 314. Interposer 31 can be a silicon interposer, a glass interposer or a ceramic interposer that contains a pattern of traces that fan out from a fine pitch at second contact pads 314 to a coarse pitch at first contact pads 312. Build-up circuitry 20 is electrically connected to interposer 31 and includes first dielectric layer 211, first conductive traces 241, second dielectric layer 261 and second conductive traces 281 which include interconnect pads 284. Stopper 113 extends from first dielectric layer 211 of build-up circuitry 20 in the upward direction and is in close proximity to peripheral edges of interposer 31. Stopper 113 as well as interposer 31 are aligned with and extend into aperture 411 of stiffener 41.

FIG. 4A is a cross-sectional view of the structure with dielectric layer 21 exposed in the downward direction. Support plate 23 can be removed to expose dielectric layer 21 by numerous techniques including wet chemical etching using acidic solution (e.g., Ferric Chloride, Copper Sulfate solutions), or alkaline solution (e.g., Ammonia solution), electrochemical etching, or mechanical process such as a drill or end mill followed by chemical etching.

FIG. 4B is a cross-sectional view of the structure with interlayer dielectric 21' and metal layer 24 laminated on dielectric layer 21. Metal layer 24 is illustrated as a copper layer with a thickness of 15 microns and is bonded to dielectric layer 21 through interlayer dielectric 21'. Interlayer dielectric 21', such as epoxy resin, glass-epoxy, polyimide and the like, typically has a thickness of 50 microns. Preferably, dielectric layer 21 and interlayer dielectric 21' are the same material. In this illustration, the combination of dielectric layer 21 and interlayer dielectric 21' is considered first dielectric layer 211 of build-up circuitry.

Alternatively, the step illustrated in FIG. 4B may be omitted, and dielectric layer 21 alone serves as first dielectric layer 211 of build-up circuitry and is directly metallized to form conductive traces after forming via openings through dielectric layer 21.

FIG. 4C is a cross-sectional view of the structure showing first via openings 213 formed through adhesive 131, first dielectric layer 211 and metal layer 24 to expose first contact pads 312. First via openings 213 may be formed by numerous techniques including laser drilling, plasma etching and photolithography. Laser drilling can be enhanced by a pulsed laser. Alternatively, a scanning laser beam with a metal mask can be used. For instance, copper can be etched first to create a metal window followed by laser. First via openings 213 typically have a diameter of 50 microns.

Referring now to FIG. 4D, first conductive traces 241 are formed on first dielectric layer 211 by depositing plated layer 24' on metal layer 24 and into first via openings 213 and then patterning metal layer 24 and plated layer 24' thereon. Plated layer 24' can be deposited by numerous techniques including electroplating, electroless plating, evaporating, sputtering, and their combinations as a single layer or multiple layers. For instance, plated layer 24' is deposited by first dipping the structure in an activator solution to render first dielectric layer 211 catalytic to electroless copper, then a thin copper layer is electrolessly plated to serve as the seeding layer before a second copper layer is electroplated on the seeding layer to a desirable thickness. Alternatively, the seeding layer can be formed by sputtering a thin film such as titanium/copper before depositing the electroplated copper layer on the seeding layer. Once the desired thickness is achieved, metal layer 24 and plated layer 24' can be patterned to form first conductive traces 241 by numerous techniques including wet etching, electro-chemical etching, laser-assist etching, and their combinations with an etch mask (not shown) thereon that defines first conductive traces 241. Accordingly, first conductive traces 241 extend from first dielectric layer 211 in the downward direction, extend laterally on first dielectric layer 211 and extend into first via openings 213 in the upward direction to make electrical contact with first contact pads 312.

Metal layer 24 and plated layer 24' thereon are shown as a single layer for convenience of illustration. The boundary (shown in phantom) between the metal layers may be difficult or impossible to detect since copper is plated on copper. However, the boundary between plated layer 24' and first dielectric layer 211 is clear.

FIG. 4E is a cross-sectional view of the structure showing second dielectric layer 261 disposed on first conductive traces 241 and first dielectric layer 211. Second dielectric layer 261 can be epoxy resin, glass-epoxy, polyimide and the like deposited by numerous techniques including film lamination, spin coating, roll coating, and spray-on deposition and typically has a thickness of 50 microns. Preferably, first dielectric layer 211 and second dielectric layer 261 are the same material.

FIG. 4F is a cross-sectional view of the structure showing second via openings 263 formed through second dielectric layer 261 to expose selected portions of first conductive traces 241. Like first via openings 213, second via openings 263 can be formed by numerous techniques including laser drilling, plasma etching and photolithography and typically have a diameter of 50 microns. Preferably, first via openings 213 and second via openings 263 have the same size.

Referring now to FIG. 4G, second conductive traces 281 are formed on second dielectric layer 261. Second conductive traces 281 extend from second dielectric layer 261 in the downward direction, extend laterally on second dielectric layer 261 and extend into second via openings 263 in the upward direction to make electrical contact with first conductive traces 241.

Second conductive traces 281 can be deposited as a conductive layer by numerous techniques including electrolytic plating, electroless plating, sputtering, and their combinations and then patterned by numerous techniques including wet etching, electro-chemical etching, laser-assist etching, and their combinations with an etch mask (not shown) thereon that defines second conductive traces 281. Preferably, first conductive traces 241 and second conductive traces 281 are the same material with the same thickness.

Accordingly, as shown in FIG. 4G, hybrid wiring board 101 is accomplished and includes interposer 31, stopper 113, stiffener 41 and build-up circuitry 20. In this illustration, build-up circuitry 20 includes first dielectric layer 211, first conductive traces 241, second dielectric layer 261 and second conductive traces 281.

Interposer 31 and stiffener 41 are attached onto first dielectric layer 211 through adhesive 131 that contacts and is sandwiched between interposer 31 and first dielectric layer 211 and between stiffener 41 and first dielectric layer 211, and are spaced from each other by stopper 113 between interposer 31 and stiffener 41. Stopper 113 extends from first dielectric layer 211 of build-up circuitry 20 in the upward direction and is in close proximity to peripheral edges of interposer 31 and inner walls of aperture 411. Adhesive 131 contacts and is coplanar with stopper 113 in the downward direction and is lower than stopper 113 in the upward direction. First conductive traces 241 of build-up circuitry 20 directly contact first contact pads 312 of interposer 31, and thus the electrical connection between interposer 31 and build-up circuitry 20 is devoid of solder.

Figure 5:
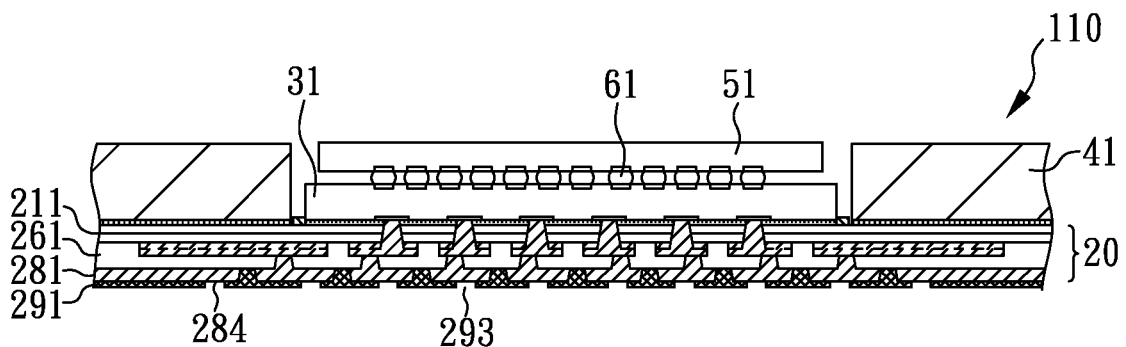
FIG. 5 is a cross-sectional view showing a three-dimensional assembly that includes a semiconductor device attached to an interposer of a hybrid wiring board in accordance with an embodiment of the present invention.

FIG. 5 is a cross-sectional view of three dimensional assembly 110 with chip 51 attached on interposer 31 via bumps 61. Interconnect pads 284 exposed from opening 293 of solder mask material 291 can accommodate a conductive joint, such as solder bump, solder ball, pin, and the like, for electrical communication and mechanical attachment with another assembly or external components. The solder mask openings 293 may be formed by numerous techniques including photolithography, laser drilling and plasma etching Embodiment 2

FIGS. 6A-6D are cross-sectional views showing a method of making a hybrid wiring board with an electrical connection between the first conductive traces and the stiffener in accordance with another embodiment of the present invention.

For purposes of brevity, any description in Embodiment 1 is incorporated herein insofar as the same is applicable, and the same description need not be repeated.

Figure 6A:
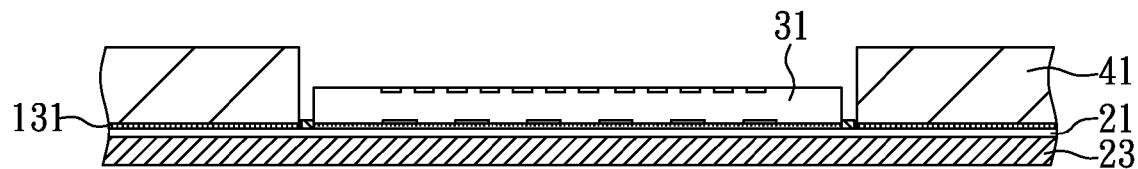
FIGS. 6A-6D are cross-sectional views showing a method of making a hybrid wiring board that includes an interposer, a stopper, a stiffener and a build-up circuitry electrically connected to the interposer and the stiffener in accordance with another embodiment of the present invention.

FIG. 6A is a cross-sectional view of the structure which is manufactured by the steps shown in FIGS. 1A-3A.

Figure 6B:
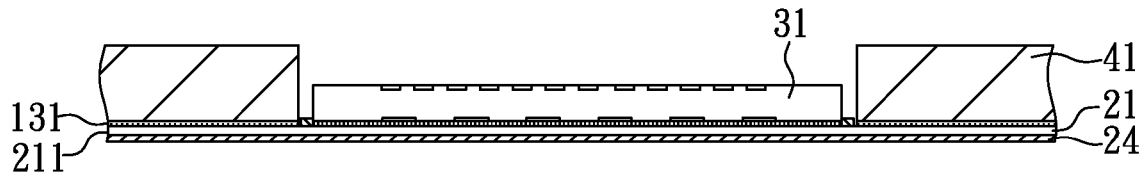

FIG. 6B is a cross-sectional view of the structure in which support plate 23 is thinned to form metal layer 24 with a desired thickness. Metal layer 24 is illustrated as a copper layer with a thickness of about 15 microns, and dielectric layer 21 is considered first dielectric layer 211 of build-up circuitry.

Figure 6C:
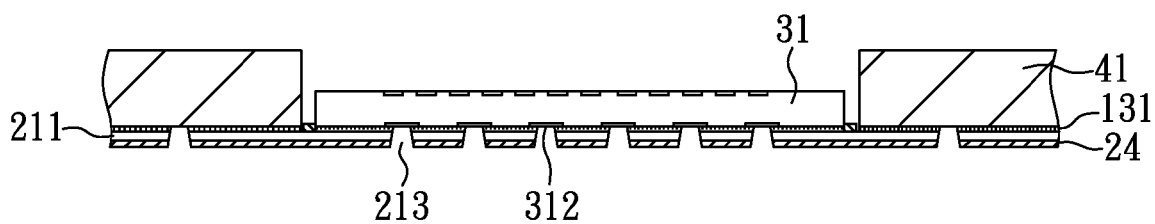

FIG. 6C is a cross-sectional view of the structure showing first via openings 213 formed through first dielectric layer 211 and adhesive 131. First via openings 213 are aligned with and expose first contact pads 312 and stiffener 41.

Figure 6D:
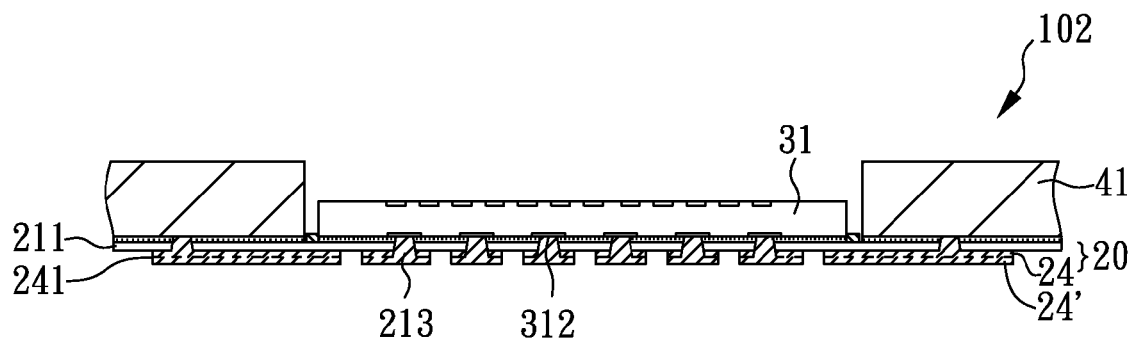

FIG. 6D is a cross-sectional view of the structure showing first conductive traces 241 formed on first dielectric layer 211 by depositing and patterning metal. First conductive traces 241 are formed by depositing plated layer 24' on metal layer 24 and into first via openings 213 and then patterning metal layer 24 and plated layer 24' thereon. Plated layer 24' covers and extends from metal layer 24 in the downward direction and extends into first via openings 213 in the upward direction to make electrical contact with first contact pads 312 and stiffener 41.

Metal layer 24 and plated layer 24' thereon are shown as a single layer for convenience of illustration. The boundary (shown in phantom) between the metal layers may be difficult or impossible to detect since copper is plated on copper. However, the boundary between plated layer 24' and first dielectric layer 211 is clear.

Accordingly, as shown in FIG. 6D, hybrid wiring board 102 is accomplished and includes interposer 31, stopper 113, stiffener 41 and build-up circuitry 20. In this illustration, build-up circuitry 20 includes first dielectric layer 211 and first conductive traces 241 and is electrically to interposer 31 and stiffener 41.

Embodiment 3

Figure 7A:
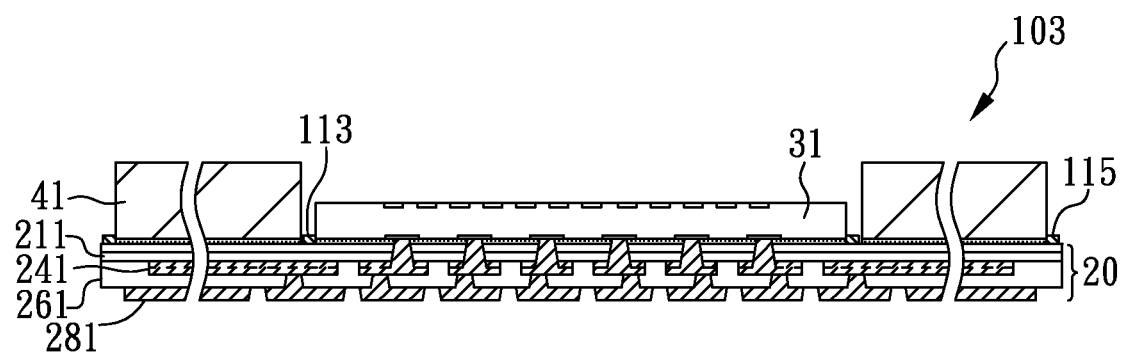
FIGS. 7A and 7B are cross-sectional views and top views, respectively, of a hybrid wiring board that includes an interposer, a stopper, a placement guide, a stiffener and a build-up circuitry electrically connected to the interposer in accordance with yet another embodiment of the present invention.
Figure 7B:
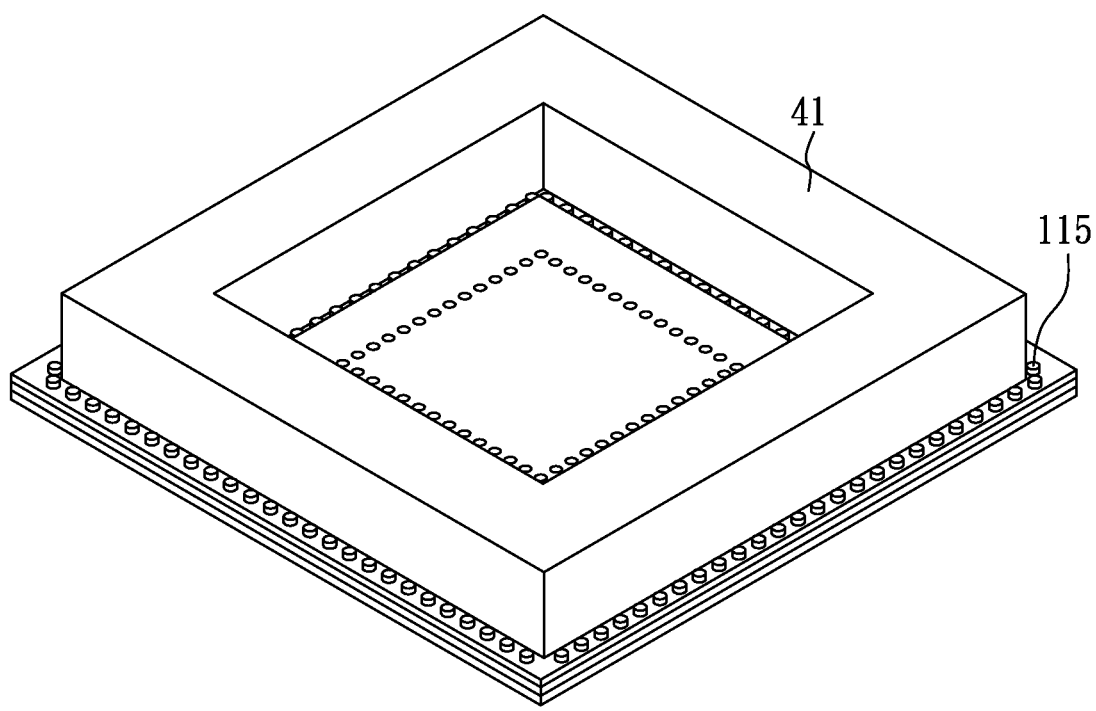

FIGS. 7A and 7B are cross-sectional and top views, respectively, of hybrid wiring board 103 with placement guide 115 in close proximity to the outer peripheral edges of stiffener 41 in accordance with yet another embodiment of the present invention.

In this embodiment, hybrid wiring board 103 is manufactured in a manner similar to that illustrated in Embodiment 1, except that placement guide 115 is simultaneously formed during stopper 113 formation by removing selected portions of metal layer 11 to accurately confine the placement location of stiffener 41. Placement guide 115 extends from first dielectric layer 211 beyond the attached surface of stiffener 41 in the upward direction and is laterally aligned with and laterally extends beyond four outer lateral surfaces of stiffener 41 in the lateral directions. Placement guide 115 is illustrated as plural metal posts and conforms to four outer sides of stiffener 41 in lateral directions. However, placement guide 115 is not limited to the illustrated pattern and can be designed in other various patterns. As placement guide 115 is in close proximity to and conforms to four outer lateral surfaces of stiffener 41 in lateral directions and adhesive 131 under stiffener 41 is lower than placement guide 115, any undesirable movement of stiffener 41 due to adhesive curing can be avoided. Preferably, a gap in between the outer peripheral edges of stiffener 41 and placement guide 115 is in a range of about 0.001 to 1 mm.

The three dimensional semiconductor assemblies and wiring boards described above are merely exemplary. Numerous other embodiments are contemplated. In addition, the embodiments described above can be mixed-and-matched with one another and with other embodiments depending on design and reliability considerations. For instance, the stiffener can include ceramic material, metal material or epoxy-based laminate, and can have embedded single-level conductive traces or multi-level conductive traces. The stiffener can include multiple apertures to accommodate additional interposers, passive components or other electronic devices and the build-up circuitry can include additional conductive traces to accommodate additional interposers, passive components or other electronic devices. For instance, the stiffener can include an aperture for placing an interposer therein and multiple apertures for placing passive components therein.

As shown in the above embodiments, a semiconductor device can share or not share the interposer with other semiconductor devices. For instance, a single semiconductor device can be mounted on the interposer. Alternatively, numerous semiconductor devices can be mounted on the interposer. For instance, four small chips in a 2×2 array can be attached to the interposer and the interposer can include additional contact pads to receive and route additional chip pads. This may be more cost effective than providing an interposer for each chip. Likewise, an aperture of the stiffener can include multiple sets of stoppers to accommodate multiple additional interposers therein and the build-up circuitry can include additional conductive traces to accommodate additional interposers.

The semiconductor device can be a packaged or unpackaged chip. Furthermore, the semiconductor device can be a bare chip, or a wafer level packaged die, etc. A semiconductor device can be mechanically and electrically connected to the interposer using a wide variety of connection media including gold or solder bumps. The stopper can be customized for the interposer. For instance, the stopper can have a pattern that defines a square or rectangular area with the same or similar topography as the interposer. External heat dissipation element such as heat spreader or heat sink can be attached to the semiconductor device by thermally conductive adhesive or soldering material. The external heat dissipation element can also be attached to the stiffener to extend the contact area and enhance the efficiency of the dissipation pathway for the semiconductor device.

The term "adjacent" refers to elements that are integral (single-piece) or in contact (not spaced or separated from) with one another. For instance, the first conductive trace is adjacent to the first contact pad but not the second contact pad.

The term "overlap" refers to above and extending within a periphery of an underlying element. Overlap includes extending inside and outside the periphery or residing within the periphery. For instance, in the position that the second contact pads of the interposer faces the upward direction, the stiffener overlaps the dielectric layer since an imaginary vertical line intersects the stiffener and the dielectric layer, regardless of whether another element such as the adhesive is between the stiffener and the dielectric layer and is intersected by the line, and regardless of whether another imaginary vertical line intersects the dielectric layer but not the stiffener (within the aperture of the stiffener). Likewise, the adhesive overlaps the dielectric layer, the stiffener overlaps the adhesive and the adhesive is overlapped by the stiffener. Moreover, overlap is synonymous with over and overlapped by is synonymous with under or beneath.

The term "contact" refers to direct contact. For instance, the conductive trace contacts the first contact pad but not the second contact pad.

The term "cover" refers to complete coverage in a vertical and/or lateral direction. For instance, in the position that the second contact pads of the interposer faces the upward direction, the build-up circuitry covers the interposer in the downward direction but the interposer does not cover the build-up circuitry in the upward direction.

The term "layer" refers to patterned and un-patterned layers. For instance, the metal layer disposed on the dielectric layer can be an un-patterned blanket sheet before photolithography and wet etching Furthermore, a layer can include stacked layers.

The terms "opening" and "aperture" refer to a through hole and are synonymous. For instance, in the position that the second contact pads of the interposer faces the upward direction, the interposer is exposed by the stiffener in the upward direction when it is inserted into the aperture in the stiffener.

The term "inserted" refers to relative motion between elements. For instance, the interposer is inserted into the aperture regardless of whether the stiffener is stationary and the interposer moves towards the stiffener, the interposer is stationary and the stiffener moves towards the interposer or the interposer and the stiffener both approach the other. Furthermore, the interposer is inserted (or extends) into the aperture regardless of whether it goes through (enters and exits) or does not go through (enters without exiting) the aperture.

The phrase "aligned with" refers to relative position between elements regardless of whether elements are spaced from or adjacent to one another or one element is inserted into and extends into the other element. For instance, the stopper is laterally aligned with the interposer since an imaginary horizontal line intersects the stopper and the interposer, regardless of whether another element is between the stopper and the interposer and is intersected by the line, and regardless of whether another imaginary horizontal line intersects the interposer but not the stopper or intersects the stopper but not the interposer. Likewise, the first via opening is aligned with the first contact pads of the interposer, and the interposer and the stopper are aligned with the aperture.

The phrase "in close proximity to" refers to a gap between elements not being wider than the maximum acceptable limit. As known in the art, when the gap between the interposer and the stopper is not narrow enough, the location error of the interposer due to the lateral displacement of the interposer within the gap may exceed the maximum acceptable error limit. Once the location error of the interposer goes beyond the maximum limit, it is impossible to align the contact pad with a laser beam, resulting in the electrical connection failure between the interposer and the build-up circuitry. According to the pad size of the interposer, those skilled in the art can ascertain the maximum acceptable limit for a gap between the interposer and the stopper through trial and error to prevent the electrical connection failure between the interposer and the build-up circuitry. Thereby, the description "the stopper is in close proximity to the peripheral edges of the interposer" means that the gap between the peripheral edges of the interposer and the stopper is narrow enough to prevent the location error of the interposer from exceeding the maximum acceptable error limit.

The phrase "mounted on" includes contact and non-contact with a single or multiple support element(s). For instance, the interposer is mounted on the dielectric layer regardless of whether it contacts the dielectric layer or is separated from the dielectric layer by an adhesive.

The phrase "electrical connection" or "electrically connects" or "electrically connected" refers to direct and indirect electrical connection. For instance, the first conductive trace provides an electrical connection between the interconnect pad and the first contact pad regardless of whether the first conductive trace is adjacent to the interconnect pad or electrically connected to the interconnect pad by the second conductive trace.

The term "above" refers to upward extension and includes adjacent and non-adjacent elements as well as overlapping and non-overlapping elements. For instance, in the position that the second contact pads of the interposer faces the upward direction, the stopper extends above, is adjacent to and protrudes from the dielectric layer.

The term "below" refers to downward extension and includes adjacent and non-adjacent elements as well as overlapping and non-overlapping elements. For instance, in the position that the second contact pads of the interposer faces the upward direction, the build-up circuitry extends below, is adjacent to and protrudes from the adhesive in the downward direction. Likewise, the build-up circuitry extends below the stiffener and the interposer even though it is not adjacent to the stiffener and the interposer.

The "first vertical direction" and "second vertical direction" do not depend on the orientation of the wiring board, as will be readily apparent to those skilled in the art. For instance, the first contact pads of the interposer faces the first vertical direction and the second contact pads of the interposer faces the second vertical direction regardless of whether the wiring board is inverted. Likewise, the stopper is "laterally" aligned with the interposer in a lateral plane regardless of whether the wiring board is inverted, rotated or slanted. Thus, the first and second vertical directions are opposite one another and orthogonal to the lateral directions, and a lateral plane orthogonal to the first and second vertical directions intersects laterally aligned elements. Furthermore, the first vertical direction is the downward direction and the second vertical direction is the upward direction in the position that the second contact pads of the interposer faces the upward direction, and the first vertical direction is the upward direction and the second vertical direction is the downward direction in the position that the second contact pads of the interposer faces the downward direction.

The wiring board and the semiconductor assembly using the same according to the present invention have numerous advantages. The wiring board and the semiconductor assembly are reliable, inexpensive and well-suited for high volume manufacture. The stiffener provides the mechanical support, dimensional stability and controls the overall flatness and the thermal expansion of the build-up circuitry such that the interposer can be securely connected to the build-up circuitry under thermal cycling even though the coefficient of thermal expansion (CTE) between them may be different. The direct electrical connection without solder between the interposer and the build-up circuitry is advantageous to high I/O and high performance. Particularly, the stopper can accurately confine the placement location of the interposer and avoid the electrical connection failure between the interposer and the build-up circuitry resulted from the lateral displacement of the interposer, thereby improving the manufacturing yield greatly.

The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional packaging techniques.

The embodiments described herein are exemplary and may simplify or omit elements or steps well-known to those skilled in the art to prevent obscuring the present invention. Likewise, the drawings may omit duplicative or unnecessary elements and reference labels to improve clarity.

Various changes and modifications to the embodiments described herein will be apparent to those skilled in the art. For instance, the materials, dimensions, shapes, sizes, steps and arrangement of steps described above are merely exemplary. Such changes, modifications and equivalents may be made without departing from the spirit and scope of the present invention as defined in the appended claims.

Although the present invention has been explained in relation to its preferred embodiment, it is to be understood that many other possible modifications and variations can be made without departing from the spirit and scope of the invention as hereinafter claimed.

What is claimed is:

1. A hybrid wiring board with a built-in stopper, comprising:
   an interposer that includes a first contact pad and a second contact pad on two opposite surfaces thereof, wherein the first contact pad faces a first vertical direction and the second contact pad faces a second vertical direction opposite the first vertical direction;
   the stopper that serves as a placement guide for the interposer and is in close proximity to and laterally aligned with and laterally extends beyond peripheral edges of the interposer in lateral directions orthogonal to the vertical directions;
   a stiffener that includes an aperture with the interposer and the stopper extending thereinto;
   a build-up circuitry that covers the stopper, the interposer and the stiffener in the first vertical direction and includes a first dielectric layer, a first via opening and a first conductive trace, wherein the first via opening in the first dielectric layer is aligned with the first contact pad of the interposer, and the first conductive trace extends from the first dielectric layer in the first vertical direction and extends through the first via opening in the second vertical direction and directly contacts the first contact pad; and
   an adhesive that contacts and is sandwiched between the interposer and the build-up circuitry and between the stiffener and the build-up circuitry.

2. The hybrid wiring board with a built-in stopper of claim 1, wherein the electrical connection between the interposer and the build-up circuitry is of solder.

3. The hybrid wiring board with a built-in stopper of claim 1, wherein the stopper extends from the first dielectric layer in the second vertical direction.

4. The hybrid wiring board with a built-in stopper of claim 1, where in the stopper include a continuous or discontinuous strip or an array of posts.

5. The hybrid wiring with a built-in stopper of claim 1 wherein the stopper is made of metal or a photosensitive plastic material.

6. The hybrid wiring board with a built-in stopper of claim 1, wherein the gap in between the interposer and the stopper is in a range of 0.01 to 1 mm.

7. The hybrid wiring board with a built-in stopper of claim 1, wherein the stopper has a height in a range of 10 to 200 microns.

8. The hybrid wiring board with a built-in stopper of claim 1, wherein the adhesive contacts and is coplanar with the stopper in the first vertical direction and is lower than the stopper in the second vertical direction.

9. The hybrid wiring board with a built-in stopper of claim 1, wherein the build-up circuitry further includes:
   a second dielectric layer that extends from the first dielectric layer and the firs conductive trace in the first vertical direction and includes a second via opening aligned with the first conductive trace; and
   a second conductive trace that extends from the second dielectric layer in the first vertical direction and extends laterally on the second dielectric layer and extends through the second via opening in the second vertical direction to the first conductive trace to provide an electrical connection for the first conductive trace.

10. The hybrid wiring board with a built-in stopper of claim 1, wherein the interposer has a through via that electrically connects the first contact pad and the second contact pad.

11. The hybrid wiring board with a built-in stopper of claim 1, further comprising an additional first via opening aligned with the stiffener, and the first conductive trace extends through the additional first via opening in the second vertical direction and directly contacts the stiffener.

12. The hybrid wiring board with a built-in stopper of claim 1, further comprising a placement guide that is in close proximity to and laterally aligned with and laterally extends beyond the outer peripheral edges of the stiffener in lateral directions orthogonal to the vertical directions.

* * * * *